(12) United States Patent
Van Rafelghem

(10) Patent No.: US 11,126,071 B2
(45) Date of Patent: Sep. 21, 2021

(54) SPATIAL LIGHT MODULATING DEVICES WITH COOLING

(71) Applicant: BARCO N.V., Kortrijk (BE)

(72) Inventor: Winter Van Rafelghem, Kortrijk (BE)

(73) Assignee: BARCO N.V., Kortrijk (BE)

( * ) Notice: Subject to any disclaimer, the term of this patent is extended or adjusted under 35 U.S.C. 154(b) by 37 days.

(21) Appl. No.: 16/627,820

(22) PCT Filed: Jul. 28, 2017

(86) PCT No.: PCT/EP2017/069220
§ 371 (c)(1),
(2) Date: Dec. 31, 2019

(87) PCT Pub. No.: WO2019/020198
PCT Pub. Date: Jan. 31, 2019

(65) Prior Publication Data
US 2020/0218141 A1   Jul. 9, 2020

(51) Int. Cl.
*G03B 21/16* (2006.01)
*G03B 21/00* (2006.01)
(Continued)

(52) U.S. Cl.
CPC ........... *G03B 21/16* (2013.01); *G03B 21/008* (2013.01); *H04N 9/3144* (2013.01); *H05K 7/20336* (2013.01); *H05K 7/20381* (2013.01)

(58) Field of Classification Search
CPC ...... G03B 21/14; G03B 21/008; G03B 21/16; H04N 9/31; H04N 9/3144; H05K 7/20381; H05K 7/20336
(Continued)

(56) References Cited

U.S. PATENT DOCUMENTS 5,331,454 A   7/1994   Hornbeck
6,300,294 B1  10/2001  Robbins et al.
(Continued)

FOREIGN PATENT DOCUMENTS

EP   1863296 A1   5/2007
JP   2012181386 A   9/2012

OTHER PUBLICATIONS

International Search Report and Written Opinion in corresponding PCT/EP2017/069220, dated Mar. 27, 2018.
(Continued)

*Primary Examiner* — William C. Dowling
(74) *Attorney, Agent, or Firm* — Hamre, Schumann, Mueller & Larson, P.C.

(57) ABSTRACT

An image modulating system including layers such as a formatter plate (PCB), an electrical connector plate called an interposer, a back cooling block, a front cooling frame and a reflective spatial light modulator. A cooling heat transfer channel is provided to transfer heat between the front cooling frame of the light valve and the back cooling block of the reflective spatial light modulator so as to reduce the thermal gradient between the front and back of the reflective spatial light modulator. The cooling heat transfer channel passes through any intervening layers such as the formatter plate (PCB), and/or the electrical connector plate called the interposer. The cooling heat transfer channel is preferably formed of a heat pipe or a circulating cooling medium.

21 Claims, 8 Drawing Sheets

(51) Int. Cl.
  *H05K 7/20* (2006.01)
  *H04N 9/31* (2006.01)
(58) Field of Classification Search
  USPC .............................................. 353/52, 56, 57
  See application file for complete search history.

(56) References Cited

U.S. PATENT DOCUMENTS

| | | |
|---|---|---|
| 6,416,183 B1 | 7/2002 | Colpaert et al. |
| 6,588,215 B1 | 7/2003 | Ghoshal |
| 6,751,027 B2 | 6/2004 | Van Den Bossche et al. |
| 6,804,967 B2 | 10/2004 | Symko et al. |
| 7,938,543 B2 | 5/2011 | Gerets et al. |
| 8,436,453 B2 | 5/2013 | Jacobs et al. |
| 10,354,572 B2 * | 7/2019 | Mikawa ............... H04N 9/3144 |
| 10,599,023 B2 * | 3/2020 | Tang .................... G03B 21/008 |
| 10,629,515 B2 * | 4/2020 | Leighton ............ G02B 26/0833 |
| 2002/0163625 A1 | 11/2002 | Tabuchi et al. |
| 2006/0197919 A1 | 9/2006 | Fujimori et al. |
| 2009/0046425 A1 | 2/2009 | Kavanagh |
| 2015/0219330 A1 | 8/2015 | Pastrik et al. |
| 2019/0179217 A1 * | 6/2019 | Tang ..................... G03B 21/16 |

OTHER PUBLICATIONS

Second Written Opinion in corresponding PCT/EP2017/069220, dated Jun. 28, 2019.
International Preliminary Report on Patentability in corresponding PCT/EP2017/069220, dated Oct. 11, 2019.

* cited by examiner

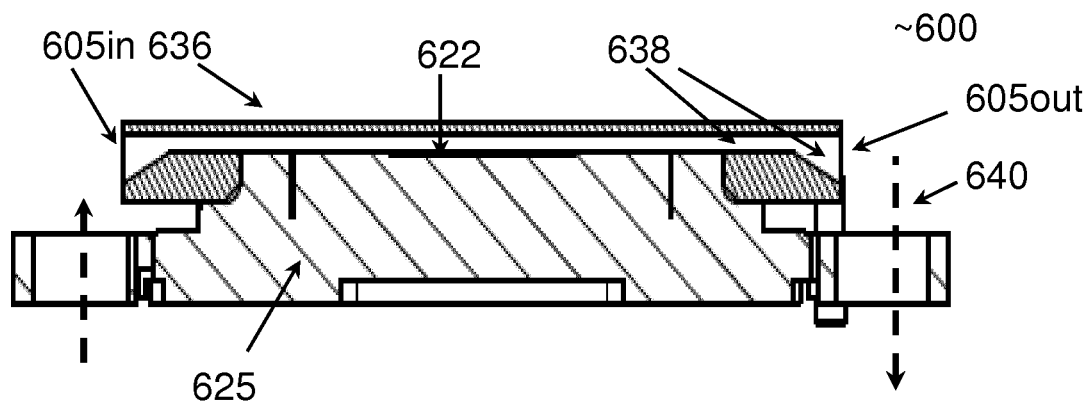
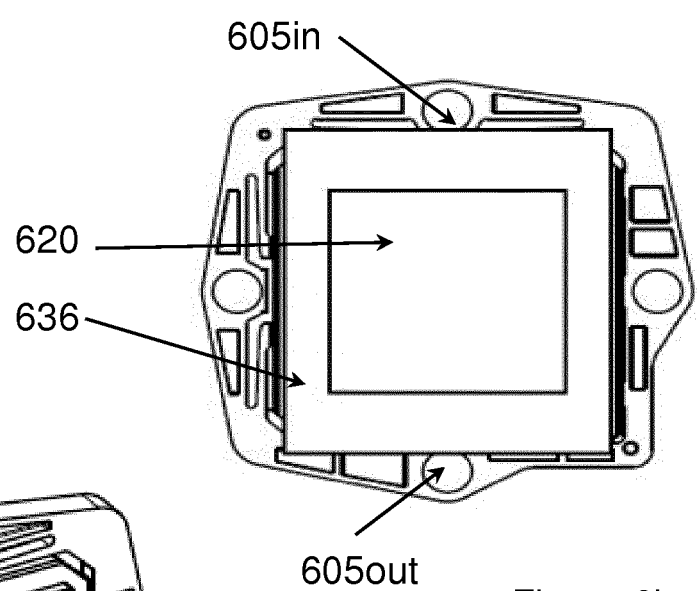
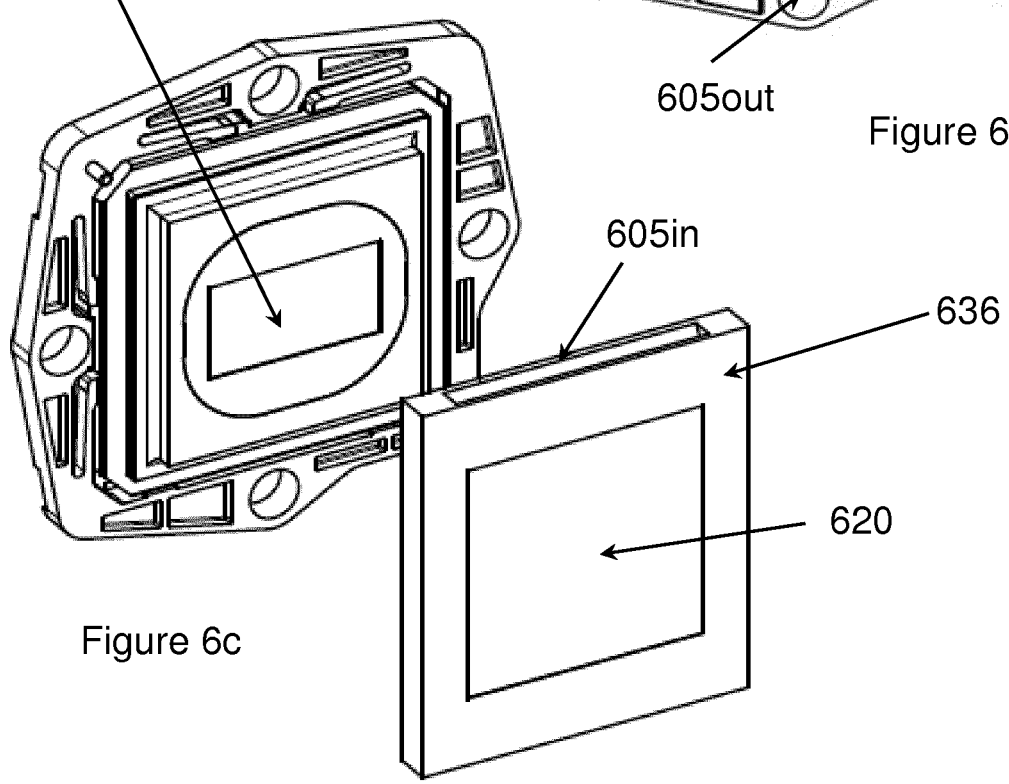
Figure 6a
Figure 6b
Figure 6c
Figure 6

SPATIAL LIGHT MODULATING DEVICES WITH COOLING

The present invention relates to cooling methods and systems for reflective spatial light modulating devices and optical systems comprising such a cooling system as well as to projectors having such cooling systems.

BACKGROUND

Image modulating systems, also known as light engines, comprising a housing including spatial light modulating devices or light valves are known. A spatial light modulating device may function either in a light transmissive mode, such as for LCD light modulators, or it may be a light reflective spatial light modulating device such as a DMD or LCD, e.g. LCOS, light modulators.

Image modulating systems comprising reflective spatial light modulating devices based on micro-mirrors may suffer less from heat generation than other schemes. However, heat is generated by both the electrical circuits and components, usually located at the back of the reflective spatial light modulating device, and also the incident light which can provide thermal energy in the form of IR light mainly to the front side of the spatial light modulating device. Some of the light is absorbed by the reflective spatial light modulating device on the front side as well as some on back side and in the reflective elements.

Many attempts to dissipate or drain the heat away from a reflective spatial light modulating device have been made. As an example, in U.S. Pat. No. 6,751,027B2, the heat is drained from the back side of the reflective spatial light modulating device by means of a thermally conductive stud. This stud contacts the back side of the reflective spatial light modulating device.

One possible alternative is to drain the heat away from the back side of a spatial light modulating device via a thermal path using thermal conductivity of several elements, whereas the front side of the device is provided with cooling air, to cool the front side using convective cooling. However, moving air may circulate dust.

To increase the lifetime of a light valve or a spatial light modulator, it is important to reduce the temperature gradient between the front and the back of the light valve or spatial light modulator. As the frame of the light modulator is usually made in Kovar, which has a thermal conductivity of approximately 17 W/m*K, it is preferred y to cool the front of the light valve.

A spatial light modulator comprises getter strips, which are for example made of a porous medium filled with PTFE particles used for lubricating the micro-mirrors. The getter strips also absorb the moisture at the edges of the micro-mirrors. However, in the presence of too much moisture, the micro-mirrors may get stuck. If the temperature of the array is lower than the temperature of the front, the PTFE particles may get absorbed and get stuck in the getters, which could damage the micro-mirrors and thereby damage the projector in which they are used. If the temperature is too high, the getters may then release the absorbed moisture which may also lead to the micro-mirrors getting stuck, which is not reversible. This is the main reason why the temperature gradient within the DMD package has to be limited to a range of about 20° C. The following US patents describe this problematic U.S. Pat. Nos. 5,331,454, 6,300,294, 8,436,453.

The maximal temperature variations which are allowable between the array or the back of the light valve and the getter stripes (located at the front of the light valve) have to stay within a range of for example ±10 degrees. Above this range, there is a significant risk of damaging the light valve. This range may depend on the type of light valve used.

In U.S. Pat. No. 7,938,543 the temperature of both front side and back side of a digital micro-mirror device can be controlled. In accordance with some embodiments, the temperature of both front side and back side of reflective spatial light modulating devices, and thus, optionally, the temperature differences over front and back side of the reflective spatial light modulating device, may be controlled jointly and/or independently one from the other.

Unfortunately, with the ever-higher lumen output required, the cooling system proposed in U.S. Pat. No. 7,938,543 does not always perform as expected. In particular, overshoots of the controlled temperatures can be observed which cause premature degradation of the light valves and of the active heat transfer devices.

Furthermore, the front side of the digital micro-mirror devices can be cooled by means of cooling pipes. However, when three digital micro-mirror devices are cooled by means of front cooling pipes, they are usually mechanically connected. This mechanical connection brings mechanical stresses during and after the alignment of the three colours micro-mirror devices. In fact, each digital micro-mirror device being dedicated to a different colour, has to be perfectly aligned so as to provide a combined image. Furthermore, the available space for such a front cooling is reduced, also due to the prism which is inserted within this available space.

A solution that can be more compact can result in a smaller projector, however there is a risk of shifting convergence (color alignment) because of mechanical stresses, if the 3 DMD's are mechanically connected to each other via a common cooling path which is for example mounted at the top, while all 3 DMD's must be adjusted separately. Such a design is illustrated in FIG. 7. Thus, to reduce the mechanical stresses between the three digital micro-mirror devices, there is a need for improvement in the art.

SUMMARY OF THE INVENTION

According to an aspect of the present invention, there is provided a number of layers of a cooled image modulating system, whereby these layers can comprise for example a formatter plate (PCB), an electrical connector called an interposer, a back cooling, for example a back cooling block, a front cooling such as a front cooling frame and a reflective spatial light modulator, characterized in that a thermal bridge is provided to transfer heat between the front cooling, e.g. the frame and the back cooling e.g. the block so as to reduce the thermal gradient between the front and back of the reflective spatial light modulator.

The thermal bridge can be a heat conductor forming a cooling channel. The heat conductor forming the cooling channel can have a non-Enhanced Heat Transfer cross-sectional surface or an Enhanced Heat Transfer cross-sectional surface. The non-Enhanced Heat Transfer conductor can be at least one conductive massive metallic heat transporter. The Enhanced Heat Transfer conductor can be at least one heat pipe or at least a fluid circulating fluid conduit attached to a cooling medium circuit, e.g. liquid or gas cooling circuit circulating a cooling medium such as a liquid or gas through the front cooling such as the front cooling frame. All of these different conductors can be thermo-conductively connected to the front cooling e.g. front cooling frame. Each can be configured to transfer heat between the front cooling e.g. the front cooling frame and the back cooling e.g. the back cooling block so as to reduce the thermal gradient between the front and back of the reflective spatial light modulator. The at least one heat pipe or at least one conductive massive metallic heat transporter or the at least one cooling medium circuit such as liquid or gas cooling circuit is preferably thermo-conductively connected not only to the front cooling frame but also to the back cooling block, and wherein the at least one heat pipe or at least one conductive massive metallic heat transporter or the at least one cooling medium circuit such as the liquid or gas cooling circuit traverses, i.e. passes through the formatter PCB. If there is an or another interfering intermediate layer such as an interposer, the at least one heat pipe or at least one conductive massive metallic heat transporter or at least one cooling medium circuit such as the liquid or gas cooling circuit may pass through this intermediate layer. If space allows, the at least one heat pipe or at least one conductive massive metallic heat transporter or the at least one cooling medium circuit such as the liquid or gas cooling circuit may avoid passing through the intermediate layer such as the interposer depending upon the shape of this intermediate layer. The at least one heat pipe or at least one conductive massive metallic heat transporter or at least one cooling medium circuit such as the liquid or gas cooling circuit may pass through the DMD package.

The at least one heat pipe or at least one conductive massive metallic heat transporter are examples of a Passive Heat Transfer Device. The at least one cooling medium circuit is an example of a Passive Heat Transfer Device or an Active Heat Transfer Device depending on how it is operated.

It is an advantage of embodiments of the present invention to improve the life time of the reflective spatial light modulator and to reduce the risks of breakage by decreasing the temperature gradient between the front and the back of the reflective spatial light modulator. In particular, for high energy density applications, for example with a highly-collimated laser beam, the thermal load increases due to the higher optical load and the back cooling of the reflective spatial light modulator may not be sufficient anymore to also adequately cool the front of the reflective spatial light modulator. Embodiments of the present invention can provide an efficient way of conducting the heat away from the front part of the reflective spatial light modulator.

Furthermore, embodiments of the present invention provide additional advantages in terms not only of thermal load but also mechanical load, as mechanical loads can in principle only be applied at the corners of the optical chassis. In fact, adding additional cooling means to the front of the reflective spatial light modulator such as a DMD as proposed in U.S. Pat. No. 7,938,543 for example will bring additional mechanical load to the reflective spatial light modulator such as the DMD package. Simply, the installation of a reflective spatial light modulator such as a DMD into a projector can involve placing a mechanical load on the reflective spatial light modulator such as the DMD, and more specifically, upon the ceramic substrate on the back of the reflective spatial light modulator. Reflective spatial light modulators such as DMDs are preferably designed such that loads can be applied in the thermal interface area, (where the interposer provides electrical connection to the formatter PCB and also to the reflective spatial light modulator such as the DMD), and at three corners on the ceramic substrate to counteract the other two loads. Loads in excess of the specified limits may result in a mechanical failure of the reflective spatial light modulator such as the DMD package. The at least one conductive massive metallic heat transporter or at least one heat pipe or the at least one cooling medium circuit such as the liquid cooling circuit of the present invention do not introduce additional mechanical loads to the reflective spatial light modulator such as the DMD package.

Furthermore, inside a projector, adding at least one conductive massive metallic heat transporter or at least one heat pipe or at least one cooling medium circuit such as the liquid cooling circuit within the reflective spatial light modulator such as the DMD package does not increase the space required and the reflective spatial light modulator such as the DMD package remains compact. This is particularly advantageous in a three-chip design wherein the space is reduced due by the Philips prism. In embodiments of the present invention there is no heat pipe or heat conductor construction extending towards the top of the prism, and the embodiments are compact and provide reduced or no mechanical stress.

Furthermore, in a three colour projector, adding mechanical cooling connections to a front cooling to each of the three reflective spatial light modulators such as the three DMD packages as well as additional connections to the back cooling, wherein the front coolings are connected together independently of the back coolings, involves additional components. Additional mechanical stresses can be applied during and after the alignment procedure of the three reflective spatial light modulators such as the three DMD packages. Embodiments of the present solution do not suffer from such disadvantages.

Additionally, the thermal path from the front of the spatial light modulator such as the DMD to the back cooling by means of a thermal bridge from the front to the back of the spatial light modulator such as the DMD, as provided by embodiments of the present invention, makes the thermal bridge shorter and more efficient.

If the thermal bridge is well designed, there is no need for additional thermo-electric coolers because the gradient between the front and back of the reflective spatial light modulator such as the DMD will be within the specifications. The thermal bridge through the formatter PCB provided by the at least one heat pipe or at least one conductive massive metallic heat transporter or the at least one cooling medium circuit such, as the liquid cooling circuit, is an advantageous solution to heat removal from a reflective spatial light modulator such as a DMD.

The PCB formatter board that is mounted onto the reflective spatial light modulator such as the DMD stack (e.g. aperture, socket plate, DMD, interposer, formatter PCB, backer plate, back cooling), and the limited space between the reflective spatial light modulator such as the DMD and the prism appears to the skilled person as an obstacle to exploring the path towards the technical solution provided by embodiments of the present invention.

In the prior art, the thermal path from the front of the DMD is either up to the top of the prism, or via the side of the formatter PCB, which both lead to a longer thermal path and, thus, to a significantly higher thermal resistance and lower efficiency and thus, also leads to a less compact system.

In an embodiment of the present invention, at least two heat pipes or at least two conductive massive metallic heat transporters or two connections to at least two cooling conduits of the cooling medium circuit are arranged on a rectangular front cooling frame, e.g. on two opposite sides which correspond to the sides of the reflective spatial light modulator, such as the DMD, where the getter strips are located.

As the getter strips are one of the most delicate elements in the reflective spatial light modulator such as the DMD package, providing the cooling means in proximity of the getter strips means that these are not affected by the temperature gradient between the front and the back of the package or the effect is reduced.

Advantageously, the at least one heat pipe or at least one conductive massive metallic heat transporter or the at least two cooling conduits have a length of at least 3 cm up to 20 cm. Preferably, the diameter of the at least one heat pipe or at least one conductive massive metallic heat transporter or the at least one cooling conduit is in the range of 3 mm to 10 mm depending upon the required heat throughput and space available.

Advantageously, the at least one heat pipe or at least one conductive massive metallic heat transporter or the at least one cooling conduit is straight.

In a preferred embodiment, the back cooling block is an active or passive heat sink such as at least one of an array of air cooling fins, a Peltier element, a cooling medium sink such as a liquid cooled heat sink, a passive heat sink, an air-cooled heat sink.

Preferably, the reflective spatial light modulator is at least one of an LC panel, an LCOS or a Digital Micro-mirror Device (DMD), or an LCoS phase modulator used for beam steering.

According to another aspect of the present invention, there is provided a projector comprising three light modulators according to embodiments of the present invention.

Advantages for three-chip designs have been mentioned above. With the solution of embodiments of the present invention, each image modulating system can be adjusted (e.g. convergence) separately without any obstruction.

According to another aspect of the present invention, there is provided an image modulating system comprising a light reflective spatial light modulator such as a DMD having a ceramic bezel, characterized in that a cooling medium channel such as a liquid cooling channel is provided within the bezel of the light valve.

Providing a cooling medium channel, such as a liquid cooling channel, within the bezel of the light reflective spatial light modulator, such as the DMD, provides very efficient means for directly cooling the front of the reflective spatial light modulator such as the DMD package. Furthermore, the cooling medium channel such as the liquid cooling channel is provided in a proximity of the getter strips.

According to another aspect of the present invention, there is provided an image modulating system comprising a light reflective spatial light modulator such as the DMD, characterized in that an over flow such channel as a liquid cooling channel is provided for flowing a coolant over the light reflective spatial light modulator such as the DMD.

According to another aspect of the present invention, a method of cooling an image modulating system is provided comprising a reflective spatial light modulator system having a formatter plate, an interposer, a back cooling, a front cooling and a reflective spatial light modulator, the reflective spatial light modulator (130) having a front and a back, the method comprising:

transferring heat between the front cooling and the back cooling through a thermal bridge, the thermal bridge comprising an Enhanced Heat Transfer conductor or a non-Enhanced Heat Transfer conductor so as to reduce the thermal gradient between the front and back of the reflective spatial light modulator, the Enhanced Heat Transfer conductor or the non-Enhanced Heat Transfer conductor being thermo-conductively connected to the front cooling and to the back cooling, and wherein the Enhanced Heat Transfer conductor or the non-Enhanced Heat Transfer conductor passes through the formatter plate.

Sides of the reflective spatial light modulator can have getter strips, the method further comprising cooling the front cooling on two opposite sides of the reflective spatial light modulator which correspond to the sides of the reflective spatial light modulator which comprise the getter strips.

According to another aspect of the present invention, a projector is provided comprising three cooled image modulating systems according to any of the embodiments of the present invention. The projector can have a plurality of reflective spatial light modulator systems, the projector being configured to control each reflective spatial light modulator system separately.

The technical effects and advantages of embodiments of according to the present invention correspond mutatis mutandis to those of the corresponding embodiments of the method according to the present invention.

BRIEF DESCRIPTION OF THE DRAWINGS

These and other technical aspects and advantages of embodiments of the present invention will now be described in more detail with reference to the accompanying drawings, in which:

FIGS. 6a to c illustrate a reflective spatial light modulator subsystem having an overflow frame for a cooling medium such as a liquid or a gas according to an embodiment of the present invention.

DEFINITIONS

Figure 1:
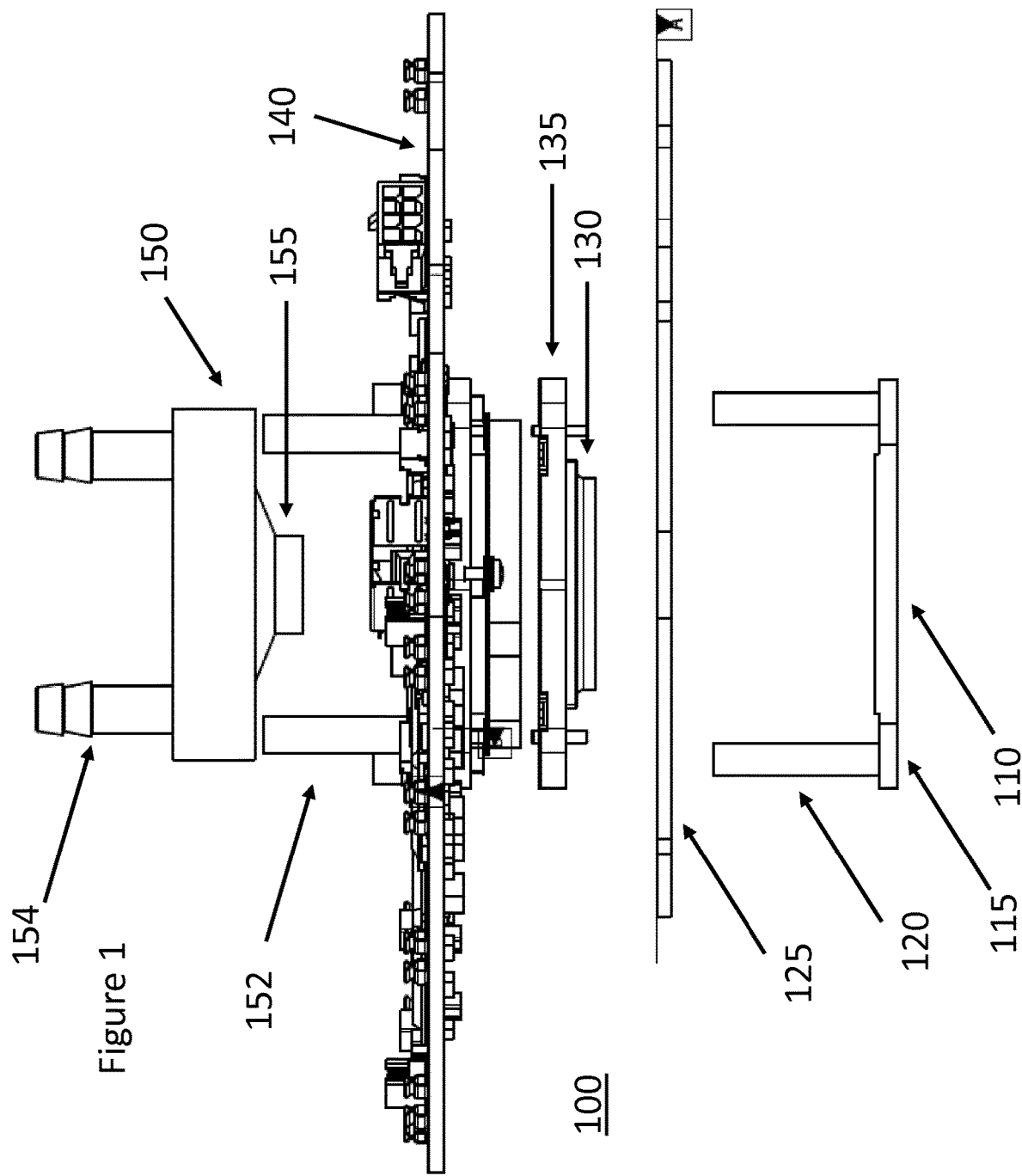
FIG. 1 shows a side view of an image modulating system comprising a thermal bridge according to an embodiment of the present invention.

The following terms are provided solely to aid in the understanding of the invention. These definitions should not be construed to have a scope less than understood by a person of ordinary skill in the art.

DMD or Digital Micro-mirror Device or Digital Mirror Device; is an example of light valve or spatial light modulator.

Light Valve. —Also known as spatial light modulator. In the text and claims the terms light valve and or spatial light modulator are to be considered as synonymous. The spatial light modulator can be a reflective spatial light modulator. The term "reflective spatial light modulator" is to be understood as a spatial light modulator which modulates the light in reflective mode, e.g. using an addressable mirror, a series of mirrors as is found in the form of a rotating polygon or an array of individually addressable mirrors, more particularly, mirroring elements being part of the light modulator mounted in the package of the housing.

A reflective spatial light modulating device may comprise different types of reflective light modulators, such as digital mirror device (DMD), a liquid crystal display (LCD) or a liquid crystal on silicon (LCOS). Preferably, the light modulators can be addressed on a pixel-by-pixel basis to thereby represent an arbitrary image of varying greyscale, e.g. video images. The DMD, also called digital mirror device or digital micro-mirror device, is a reflective spatial light modulator, comprising a semiconductor-based array of fast, reflective digital light switches that precisely control reflection of a light source using, for example, a binary pulse width modulation technique. A DMD has a matrix of a plurality of individually addressable and electrically deformable or moveable mirror cells. In a first state or position, each mirror cell of the digital mirror device acts as a plane mirror to reflect the light received to one direction, through a projection lens towards e.g. a projection screen, while in a second state or position they project the light received to another direction, away from the projection screen. In a reflective liquid crystal display (also known as LCOS) light valve, the light is not modulated by a mechanical displacement of a mirror, but by changing the polarization state of the liquid crystals in the light valve.

Package. The term "package" is to be understood as a preassembled unit.

Package Front Side. The term "package front side" is to be understood as the side of the package of the spatial light modulating housing which is facing the incident light. This side is also emitting projection light towards the projection optics.

The term Enhanced heat transfer surface is an accepted art term meaning a surface with special features that provide a higher thermal performance, per unit base surface area compared with a reference. In the present invention, the base surface refers to a cross-section through a heat conductor and the heat energy that can pass through that cross-sectional surface for a certain temperature gradient. The heat transfer is greater per unit base surface area and temperature gradient than if the heat conductor were made of a reference of pure copper. An Enhanced heat transfer conductor preferably has an effective thermal conductivity of greater than 1000 or more than 5000 or more than 10,000 or more 20,000 or more than 50,000 W/(m·K) but less than 100,000 W/(m·K).

Examples of devices with an Enhanced heat transfer cross-sectional surface are, for example, a heat pipe or a conduit with a circulating heat carrier.

Such conductors achieve:
a size Reduction;
increased heat exchange rate; and
reduced temperature differences.

A non-Enhanced heat transfer cross-sectional surface of a heat conductor as used in the present application has a thermal performance, per unit base surface area and temperature gradient which is the same as pure copper or less, whereby the base surface refers to a cross-section through the heat conductor. A non-Enhanced heat transfer conductor preferably has a thermal conductivity of greater than 150, more than 200 or more than 300 W/(m·K) but less than or equal to 400 W/(m·K).

Peltier (element). Also known as Peltier-Seebeck element. A thermos-electric device that can transfer heat from one point to another in function of the direction of the current circulating through it.

Passive Heat Transfer Device. The term "passive cooling device" and more generally "passive heat transfer device" is to be understood as a device the thermal energy of which taken from the object to be cooled or heated, cannot be controlled by means of a controlling unit, i.e. it dissipates heat in an open loop manner.

Examples of passive heat transfer devices are e.g. a simple array of cooling fins or a heat pipe.

A heat pipe is a heat-transfer device that combines the principles of both thermal conductivity and phase transition to efficiently manage the transfer of heat between two solid interfaces.

At the hot interface of a heat pipe, a liquid in contact with a thermally conductive solid surface turns into a vapour by absorbing heat from that surface. The vapour then travels along the heat pipe to the cold interface and condenses back into a liquid—releasing the latent heat. The liquid then returns to the hot interface through capillary action, centrifugal force, or gravity, and the cycle repeats. Due to the very high heat transfer coefficients for boiling and condensation, heat pipes are highly effective thermal conductors. The effective thermal conductivity varies with heat pipe length, and can approach 100 kW/(m·K) for long heat pipes, in comparison with approximately 401 W/(m·K) for copper and 230 W/(m·K) for aluminium.

A heat pipe can be specially optimised for high performance. High performance heat pipe have a thermal absorption and transfer system which can carry over 1000 times more power than an equivalent size rod of copper for the same applied temperature gradient.

A High performance heat pipe comprises of a sealed evacuated metal envelope containing a porous capillary action wick lining which is charged with a working fluid. The preferred working fluid is usually high purity water which exists as a saturated vapour within the vessel.

Heat pipes can take the form of a rod of circular cross section with diameters ranging from 3 to 50 mm, and lengths which may be from three centimetres to 15 or more centimetres long. Other sections include rectangular, flattened and also annular Heat pipes with an open centric bore section.

Active Heat Transfer Device or Active Heat Transfer Element. In the text and claims the terms Active heat transfer device, active heat transfer element or effector are to be considered as synonymous. The term "active cooling device" and more generally "active heat transfer device" is to be understood as a device the thermal energy of which taken from the object to be cooled, can be controlled by means of a controlling unit. Throughout the application, the term effector can also be used instead of Active Heat Transfer Device. As an example, an active cooling device may be a Peltier element. Any form of micro-cooling device can be used. For example, one type of cooling devices are micro-electro-mechanical refrigeration systems. One example of such a system may be a refrigeration system based on a magnetic refrigeration cycle whereby a micro-electro-mechanical switch, a micro relay, a reed switch or a gate switch may be used for switching between an absorption phase and a heat rejection phase of such a cycle. Such devices are described in more detail in e.g. U.S. Pat. No. 6,588,215 B1 from International Business Machines Corporation. Another example of such a system may be a thermo-acoustic refrigerator based on providing a temperature difference across a stack using a piezoelectric driver. Thereby a high frequency sound is generated which, by interaction with one or more parts of the stack creates a temperature gradient, thus allowing cooling, as e.g. described in more detail in U.S. Pat. No. 6,804,967 B2 by University of Utah. Still another example of such a system may be a micro-electro-mechanical system whereby expansion of gas is controlled using a micro-electro-mechanical valve, as described in more detail in U.S. Pat. No. 6,804,967 by Technology Applications, Inc. It is an advantage of several of these cooling means that they can be applied using micro-electro-mechanical technology, lithography or thin film deposition techniques such that integration in the detection system can be performed and that their size is compact.

A conductive massive metallic heat transporter refers to a massive metal conductor made from a high conductivity metal such as copper or aluminium or alloy of these.

Ceramic Substrate defines the structures which form the mechanical, optical, thermal, and electrical interfaces between the reflective spatial light modulator such as the DMD chip that contains the reflective spatial light modulator such as the DMD active array, window glass, and window aperture and the end-application optical assembly DMD active array—the two-dimensional array of active DMD mirrors which reflect light.

Thermal interface area—the area on the ceramic substrate which allows direct contact of a heat sink or other thermal cooling device Window glass—the clear glass cover which protects the spatial light modulator such as the DMD active area.

Window aperture—the dark coating on the inside surface of the window glass around the perimeter of the active array Interposer—Component that provides electrical connection to a reflective spatial light modulator such as a DMD. For example a reflective spatial light modulator such as a DMD can utilize a land grid array for the system electrical connections (similar to a socket or connector). Connections on the reflective spatial light modulator, such as the DMD, connect to contacts on the interposer which can be arranged to connect via traces or electrical connections through the interposer to contact traces or electrical connections on a PCB. The interposer can have the electrical connections outside the active area of reflective spatial light modulator such as the DMD, i.e. to the side or sides of this active area, while also making contact with the PCB formatter.

LGA—Land Grid Array refers to a two-dimensional array of electrical contact pads on the reflective spatial light modulator such as the DMD.

Optical Assembly—The sub-assembly of the end product which consists of optical components and the mechanical parts that support those optical components Optical Chassis—The main mechanical part used in the optical assembly to mount the optical components e.g. component of the reflective spatial light modulator such as the DMD, lens, prism, and so forth.

Optical Illumination Overfill—The optical energy that falls outside the active area, and which does not contribute to the projected image.

Optical Interface—Refers to the features on the optical chassis used to align and mount the reflective spatial light modulator such as the DMD.

PCB—Printed-Circuit Board

DETAILED DESCRIPTION OF THE INVENTION

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Figure 4:
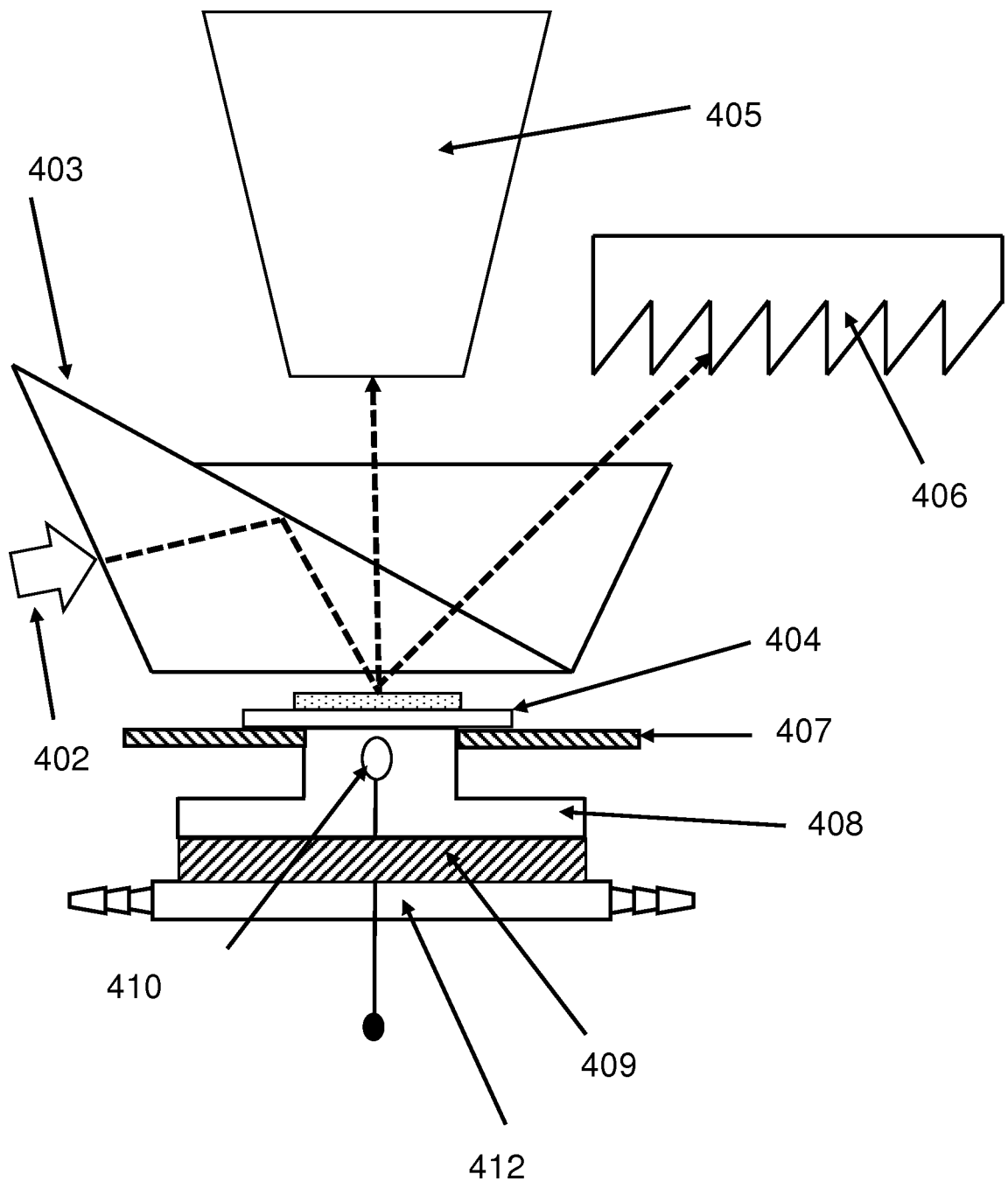
FIG. 4 shows an image modulating system comprising a prism and a light dump according to the prior art.

FIG. 4 shows a schematic view of a light projection system according to the prior art. The projection system comprises a light valve 404 which can be positioned on a Printed Circuit Board (PCB) 407 and which is in thermal contact with a metal stud 408. In the example of FIG. 4, the light valve 404 is a DMD and the metal stud 408 contacts the back side of the package of the DMD through a hole in the PCB 407. A thermal interface material can be used between the metal stud 408 and the package of the light valve 404.

A light source (not shown) illuminates the light valve 404 through a prism assembly 403. The light 402 is reflected towards projection optics 405 or towards a light dump 406 in function of the position of the micro-mirrors of the light valve 404. A first active heat transfer device 409 transfers heat to or from the metal stud 408. A sensor 410 measures the temperature of the light valve 404. By cooling or heating-up the metal stud, it also cools or heats up the back of the light valve 404.

In the example of FIG. 4, the heat sink is a liquid or gas cooled heat sink or, for example, the heat sink 412 can be in contact with a Peltier element.

However, in the example illustrated on FIG. 4, no cooling is provided to the front of the DMD. Furthermore, the front of the DMD is not only heated by the electronics of the DMD but also by the incoming optical power that is absorbed by the light valve or DMD. As the DMD frame is made, for example, of Kovar, the heat is not evacuated and a temperature gradient is present within the DMD.

Figure 7:
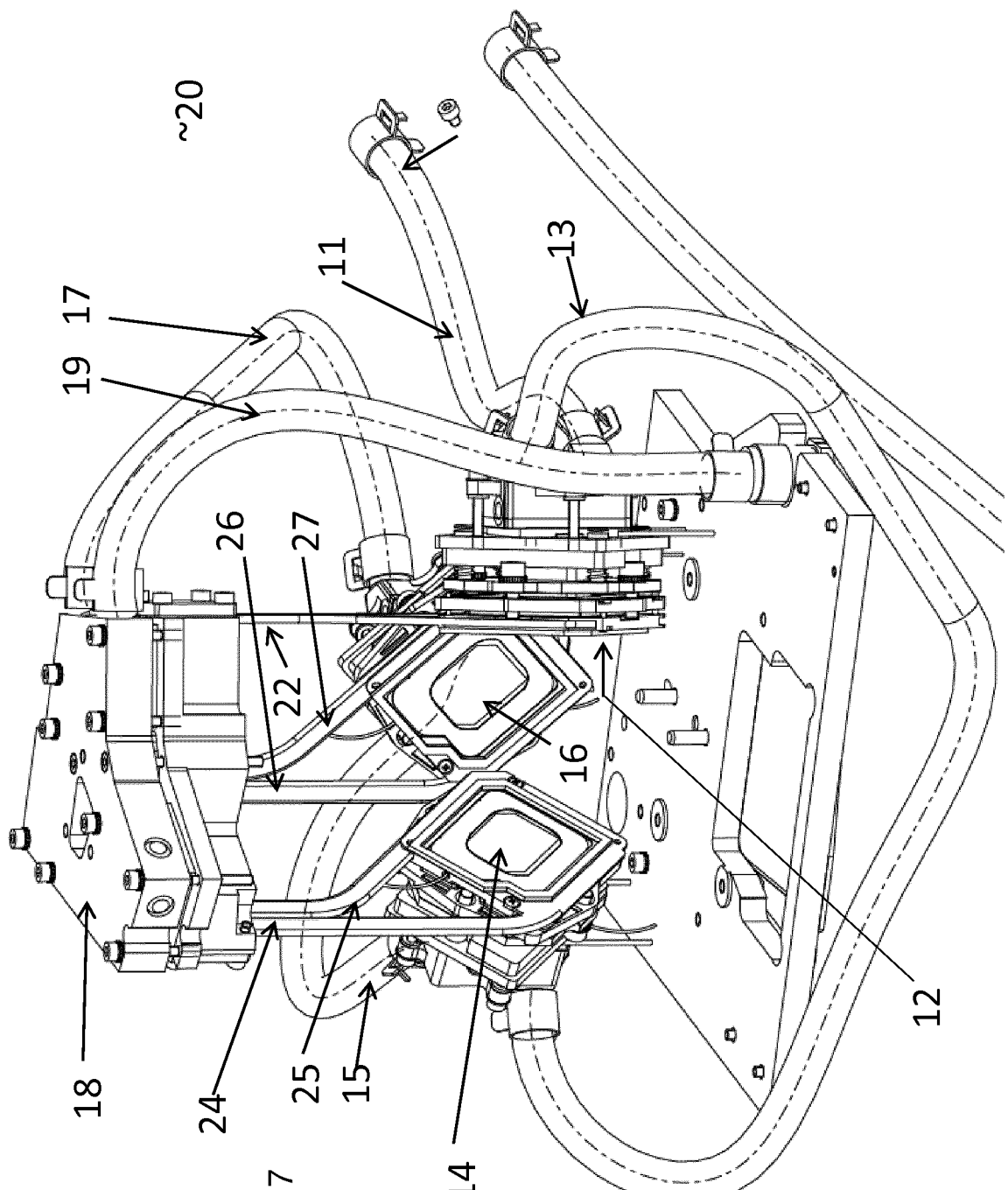
FIG. 7 shows a projection system comprising three spatial light modulators and separate cooling means for cooling the front of the light modulators as well as the back, according to the prior art.

The state of the art solves this problem by providing cooling means at the front of the light valve or DMD, or a first (set of) heat transfer element(s) transferring heat between the front of the light valve (e.g. the front side of a DMD) and a first heat sink/source. A second (set of) heat transfer element(s) transfers heat between a second part of the light valve (e.g. the back side of the DMD) and a second heat sink/source. Such a solution is for example described in the patent application EP 1 863 296 A1. However, this solution does not solve the problem of overshoots and the temperature gradient within the light valve can fall outside of the acceptable range. In front cooling systems for a light projection system of this type, there is a risk of shifting convergence (e.g. color alignment) because of the mechanical stresses induced at manufacture or during later adjustment. The 3 DMD's are mechanically connected to each other via common cooling paths which are for example mounted at the top, while all 3 DMD's must be adjusted separately. Such a design 20 is illustrated in FIG. 7. There are 3 DMDs, 12, 14, 16. The first set of heat transfer elements are provided by stiff cooling connections 22; 24, 25; and 26, 27 between the front of DMDs 12, 14, 16 respectively and a main cooling block 18. The second set of heat transfer elements is provided by a cooling circuit having a first inlet conduit 11 to a back cooling plate of DMD 12, an outlet conduit 13 that is the inlet to a back cooling plate of DMD 14, an outlet conduit 15 that is the inlet to a back cooling plate of DMD 16, and an outlet conduit 17 that is the inlet to the main cooling block 18 which has an outlet conduit 19. In this deign there are many mechanical connections between the DMDs and to the cooling block 18 which makes adjustment such as aligning the DMDs more difficult. They can also increase mechanical stresses on the DMDs.

Embodiments of the present invention provide means to transfer heat between the first part (front) and the second part (back) of the light reflective spatial light modulator such as the DMD.

In a first embodiment of the present invention, a heat conducting bridge is provided to facilitate the transfer of heat between the front of the reflective spatial light modulator such as the DMD and the back of this light modulator. In essence, the heat conducting bridge decreases the thermal resistance between the first part of the reflective spatial light modulator, such as the DMD, and the second part of the reflective spatial light modulator, such as the DMD, thereby decreasing the temperature difference that would otherwise exist between the first and the second parts of the modulator (e.g. front and back thereof). The thermal bridge can be dimensioned (e.g. its geometry and the material it is made of and its operation) in function of the maximal temperature difference allowed between the first part and the second part and the maximum heat flux expected. The maximum heat flux expected can be determined e.g. by means of a mathematical model taking into account the optical power illuminating the light valve, e.g. the reflective spatial light modulator such as the DMD, the thermal interface material used as interface between the reflective spatial light modulator such as the DMD and the thermal bridge, the temperature of the gas (usually air) in the projector, the heat transfer paths (e.g. by conduction, convection and/or radiation) between various parts of the projector and the light reflective spatial light modulator such as the DMD etc.

An advantage of embodiments of the present invention is the reduced complexity of any other cooling medium circuit such as a liquid cooling system by e.g. eliminating the need for an additional liquid or gas cooled cold plate at the front of the reflective spatial light modulator such as the DMD. The present invention does not exclude a cooling medium circuit such as a liquid or gas cooling system at the front of the reflective spatial light modulator such as the DMD. For example, the pipes carrying the gas or liquid from a cooled gas or liquid reservoir to the cold plates and back to the gas or liquid reservoir can be less "circuitous" and the total length of the pipes required to transport the fluid can be reduced.

FIG. 1 illustrates an embodiment of an image modulating system according to the present invention. The image modulating system 100 comprises the following components, a spatial light modulator such as a DMD, a connector board for electrically connecting to contacts of the spatial light modulator and for connecting to an electronics board, a cooling frame 115, a back cooling block and at least one heat pipe or at least one conductive massive metallic heat transporter or at least two cooling conduits with circulating cooling fluid which transfers heat energy between the front cooling frame and the back cooling block.

Figure 2:
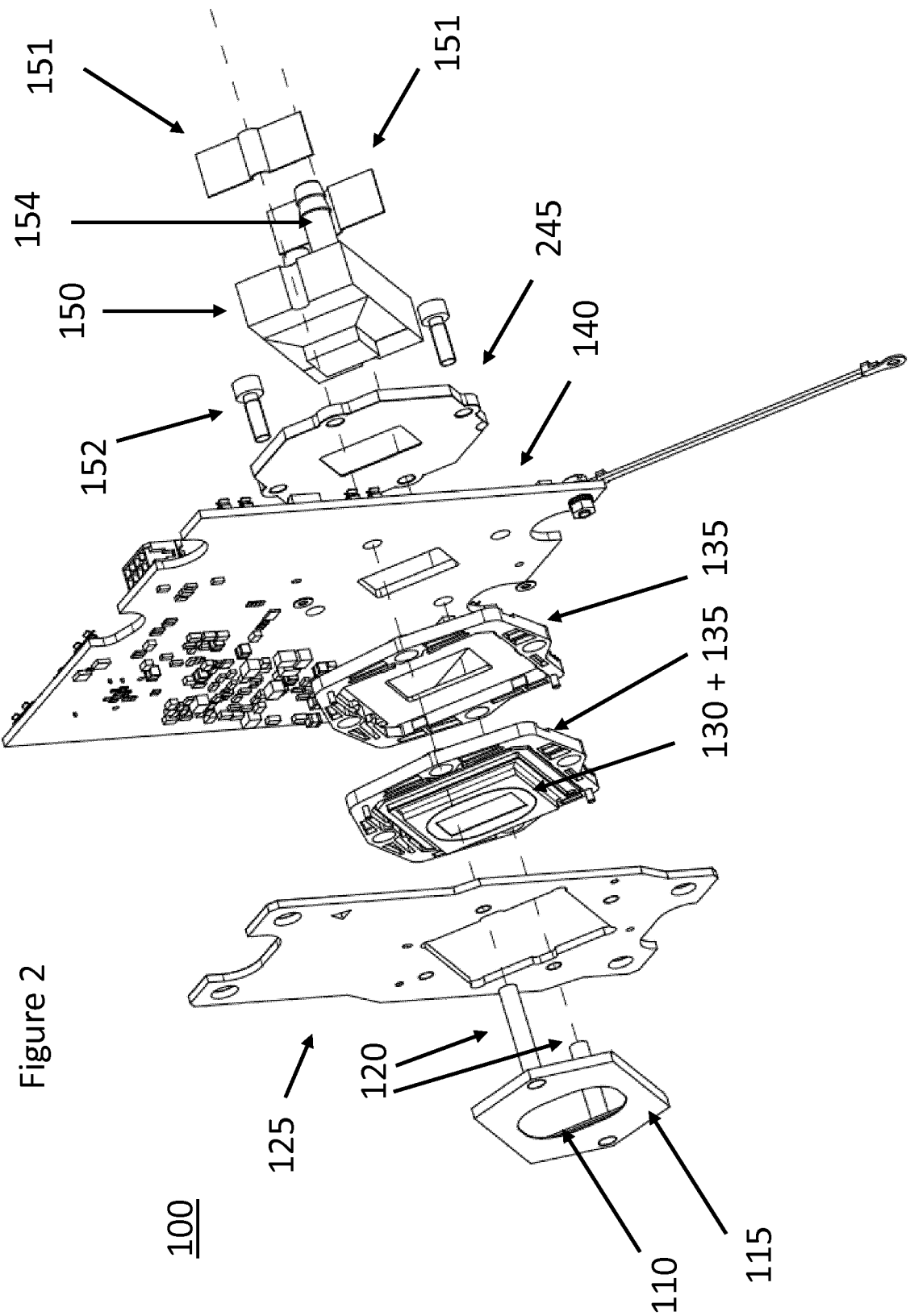
FIG. 2 shows a view in perspective of FIG. 1.
Figure 3:
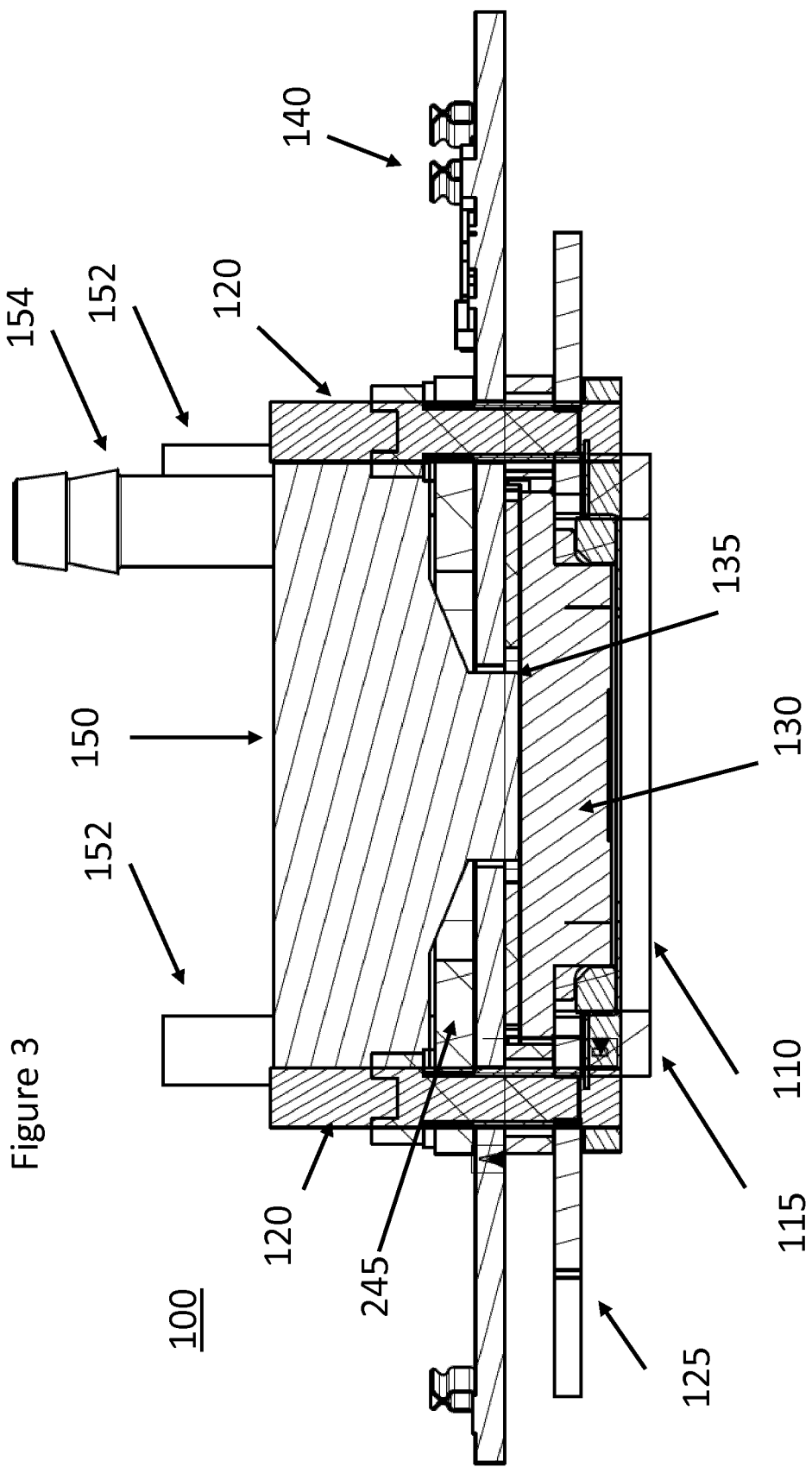
FIG. 3 shows the image modulating system of FIG. 1 mounted.

The image modulating system 100 of FIG. 1 is also shown in perspective in FIG. 2 and in an assembled condition in FIG. 3.

The image modulating system comprises a light aperture 110 configured to be surrounded by a mask to block unwanted light or overfill light from being incident onto the reflective spatial light modulator or DMD 130. It prevents overfill light from heating up the reflective spatial light modulator or DMD and also prevents stray light from being reflected to the image. Overfill light represents light which is not used for generating an image, i.e. light which is outside of the pupil.

Optical illumination overfill is defined as the optical energy that falls outside the active area of the reflective spatial light modulator or DMD. Overfill is wasted light that is not reflected by the reflective spatial light modulator elements such as the DMD micro-mirrors and does not contribute to the brightness of a projected image. The shape and spatial distribution of the optical energy in the overfill region is determined by the system optical design.

Excess optical illumination overfill can result in higher thermal loads on the reflective spatial light modulator or DMD which must be cooled by the system, or various types of image artefacts can occur (for example, stray light), or both can occur.

The light aperture 110 is preferably combined with a front cooling frame 115 surrounding the aperture 110 to guide the heat generated by the overfill light towards the back cooling. Although the front cooling frame 115 reduces the heating of the front of the reflective spatial light modulator such as the DMD, it does not cancel the heating. In a modification of this embodiment, the light aperture 110 can also be thermally isolated from the front cooling frame 115. It is preferable if the front cooling frame 115 surrounds the light aperture 110 all the way around the circumference of the light aperture 110 and that equal and uniform cooling around the circumference is provided to avoid thermomechanical stresses in the reflective spatial light modulator such as the DMD 130. As the most critical thermal elements of the light valve are the getter strips, in a preferred embodiment, the front cooling frame is located in proximity of the getter strips. As there are usually two getter strips located on two opposite sides of the reflective spatial light modulator such as the DMD 130, the front cooling frame is preferably at least in proximity of these sides.

The front cooling frame 115 is preferably made of a thermally conductive material, preferably having a thermal conductivity of more than 80 W/m*K, measured at ambient temperature being 20° C., or more preferably out of a highly thermally conductive material having a thermal conductivity of more than 150 W/m*K preferably more than 200 or 300 150 W/m*K at ambient temperature. As an example, the frame is preferably provided from a metal or a metallic substance e.g. Copper, Copper alloy, Aluminum or Aluminum alloy. Alternatively, thermally conductive ceramics may be used. The frame may have a thickness of about 2.5 to 8 mm such as 3.7 mm.

Furthermore, the light aperture 110 may be made of a transparent material, which can be attached by means of a sealing to the front cooling frame 115, in order to prevent dust from damaging the reflective spatial light modulator such as the DMD 130. The sealing can be for example a silicone rubber seal which thereby encloses the reflective spatial light modulator in an airtight way to form a substantially sealed chamber. The term "substantially sealed" is to be understood as it is sealed from the ambient air so that no significant amounts of dust or smoke particles can enter the chamber. However, it becomes even more difficult to drag the heat away from the sealed chamber.

The image modulating system for use with embodiments of the present invention can comprise a plurality of thermal bridges 120 which are attached to the front cooling frame 115. This frame 115 is mechanically and thermally connected to the front surface of the reflective spatial light modulator such as the DMD 130 to serve as a thermal guide which results in the heat energy being transported towards the back of the reflective spatial light modulator such as the DMD, so as to reduce the temperature gradient between the front and the back of the reflective spatial light modulator such as the DMD 130.

Since the reflective spatial light modulator frame such as the DMD frame is made out of a material such as Kovar, the thermal conduction of the reflective spatial light modulator frame such as the DMD frame itself is very low. With the addition of the front frame 115 and the thermal bridges 120, a very short and thermally good conductive path is provided between the front and the back of the reflective spatial light modulator such as the DMD, which results in a low temperature gradient at all times. The thermal bridges 120 can also further be connected to the back of the reflective spatial light modulator such as the DMD e.g. to a stud and/or a back cooling block 150 by means of a thermoconductive mechanical fixing such as a clamp 151 for example. The cooling block 150 is mounted on the PCB formatter board 140 by means of at least one thermally connected stud 152. The hose barbs 154 (i.e. a connector from gas or liquid cooling to cooling hoses) are fixed as is known in the art to the cooling block 150.

The socket plate 125 is the structural base of the reflective spatial light modulator such as the DMD 130. The socket plate 125 and the backer plate 245 (shown in FIG. 2) are placed on both sides of the reflective spatial light modulator such as the DMD 130, as a sandwich (stack). In the final configuration, the socket plate 125 is directly attached to the prism (not shown) in a multi-chip configuration.

The reflective spatial light modulator such as the DMD 130, is the main component of the image modulating system to be cooled.

The interposer 135, which is located between the reflective spatial light modulator such as the DMD and the formatter PCB 140, can receive or capture the reflective spatial light modulator such as DMD 130 from the back and provides a good electrical connection between the reflective spatial light modulator such as the DMD and the formatter PCB 140. When captured, the reflective spatial light modulator such as the DMD is partially embedded in the interposer 135. In FIG. 2 the interposer 135 is shown alone and also (130+135) when it has captured the reflective spatial light modulator such as the DMD 130. In FIG. 2 the final assembly includes just the combination 135+130. The formatter PCB 140 is the electronics driver board. The backer plate 245 is screwed together with the socket plate 125 (FIG. 2).

A stud 155 (408 in FIG. 4 or in FIG. 2, the cooling block 150 incorporating the stud 155) is thermally and mechanically connected to the back surface of the reflective spatial light modulator such as the DMD. The stud increases the (usually rather small) back surface of the reflective spatial light modulator such as the DMD to a larger cooling surface and brings the heat energy—from the to be cooled thermal interface area—out of the reflective spatial light modulator such as the DMD stack and renders the surface reachable for cooling. The thermal bridge can also be thermally connected to this stud. The cooling of the projector is thermally connected to this stud (for example with a thermo-electric cooler).

The stud 155 is preferably made from a highly conductive material e.g. having a thermal conductivity of more than 150 W/m*K, measured at ambient temperature being 20° C. such as a metal e.g. copper or aluminium or an alloy of either of these. The stud couples the back side of the reflective spatial light modulator such as the DMD 130 thermally with a passive or an active, i.e. controllable, cooling device 150. As an example, a simple array of air cooling fins can be used as a passive heat sink. A Peltier element can be used as an active cooling device 150, whose cold side is coupled to the stud 155, whereas its warm side is thermally coupled to a heat dissipating means, e.g. air-cooled cooling fins or a liquid cooled heatsink. An alternative active cooling device is an air-cooled heat sink, e.g. an array of cooling fins, to which the amount of cooling air is controllable by controlling the rotation speed of an air fan. Another alternative active cooling device is a water—or liquid cooled heat sink, to which the amount of cooling liquid is controllable by controlling the output of a liquid pump coupled to this liquid cooled heat sink. As an example, the cooling liquid can be a mixture of glycol and demineralized water.

The thermal bridge 120 is thermally connected to the cooling block 150.

In a preferred embodiment of the present invention, the thermal bridge 120 is a heat pipe or the at least two conduits of a circulating cooling circuit e.g. each having an effective thermal conductivity of more than 410 W/m*K, measured at ambient temperature being 20° C. The typical effective thermal conductivity of a 75 mm heat pipe, having a diameter of 6 mm is 6600 W/*mK at ambient temperature. In embodiments of the present invention, heat pipes or the at least two conduits of the circulating cooling circuit in the range 3 to 10 mm diameter are suitable. The effective thermal conductivity of a heat pipe does not drop so much as the length increases, so that a longer heat pipe can have almost the same thermal conductivity as an equal shorter one. The same is true for the at least two conduits of the circulating cooling circuit. Thus, the length of the heat pipe(s) or the at least two conduits of the circulating cooling circuit can be chosen to fit to the distance between the front and back of the reflective spatial light modulator such as the DMD, e.g. greater than 3 cm. The result is an improved compactness, while also having the advantage that the reflective spatial light modulators, such as the DMDs, are not so restrictively mechanically connected to each other. In addition, the fact that heat pipes or the at least two conduits of the circulating cooling circuit don't have to go in the pace between the prism and the DMD, there's more space for larger diameter heat pipes or conduits. Whereas current cooling systems having flattened heat pipes are flattened and bent to fit while respecting physical constraints, this is not required for heat pipes or the at least two conduits of the circulating cooling circuit in embodiments of the present invention.

The length and diameter of the heat pipe or the at least two conduits of the circulating cooling circuit should be in accordance with the required cooling power, the light output and the mechanical constraints.

Advantages of the invention lie in the compactness that the conductive massive metallic heat transporters and even more so, the heat pipes or the at least two conduits of the circulating cooling circuit bring to the design of the reflective spatial light modulator such as the DMD. Furthermore, the various conductive massive metallic heat transporters or heat pipes or the at least two conduits of the circulating cooling circuit of different reflective spatial light modulators such as DMDs are not mechanically connected to each other. With embodiments of the present invention, the conductive massive metallic heat transporters or the heat pipes or the at least two conduits of the circulating cooling circuit do not have to fit between the prism and the various reflective spatial light modulators such as the DMDs in a multi-chip configuration. For example, heat pipes running from the front reflective spatial light modulators such as the DMDs have to be flattened and deformed to comply with the physical constraints of the system (see FIG. 7). With embodiments of the present invention, there is thus more space for larger diameters of conductive massive metallic heat transporters or heat pipes or the at least two conduits of the circulating cooling circuit, and, thus, the effective thermal conductivity is improved.

The length and diameter of the conductive massive metallic heat transporters or the heat pipe or the at least two conduits of the circulating cooling circuit should be in accordance with the needed cooling power, the light output and the mechanical constraints as known to the skilled person.

Instead of a heat pipe or the at least two conduits of the circulating cooling circuit, it is less preferred if a conductive massive metallic heat transporter is used in certain situations. This is only advised when less heat transfer is required. The metal preferably has a thermal conductivity of at least 150 W/m*K, measured at ambient temperature being 20° C., and is preferably copper or aluminium or an alloy of each of these.

A thermal bridge made of such a highly thermo-conductive metal would provide less thermal conduction than a heat pipe, as the effective thermal conductivity of such materials, such as copper, is at least 10 times lower than the one of heat pipes. Also they are less complex than at least two conduits with an associated circulating cooling circuit. Heat pipes are therefore preferred for embodiments of the present invention with a selected thermal conductivity in accordance with the light output and/or the needed cooling power, so as to reduce the temperature gradient sufficiently within reflective spatial light modulators, such as the DMDs. As discussed above, the temperature gradient between the front and the back of the reflective spatial light modulator such as the DMD should be below 10° C. to avoid damaging the spatial light modulator.

In a preferred embodiment, the conductive massive metallic heat transporters or the heat pipes or cooling conduits used for the thermal bridge 120 have a diameter in the range of 3 to 10 mm.

Preferably, omnidirectional heat pipes are used, such that the performance of the heat pipe is not affected by the orientation of the heat pipe. However, as the front frame 115 of the light modulator e.g. DMD is usually hotter than the back-cooling block 150 due to the light hitting on the front frame 115, the heat pipe may have a thermal conductive performance dependent on the orientation of the heat pipe.

The number of heat pipes depends as well on the diameter of each individual heat pipe used.

As shown on FIG. 2, to provide the shortest thermal bridge 120, holes are provided in the various components of the image modulating system through which the thermal bridge is installed. For example, where necessary in the interposer 135, holes are provided at positions on the sides of the reflective spatial light modulator such as the DMD 130. In the formatter PCB 140, holes 141 can also be provided if required, i.e. where there is no possibility to avoid the PCB. The existing designs of the formatter PCB 140 and/or of the interposer 135 can be used provided suitable holes can be used to provide a path for the thermal bridge 120. Alternatively, dedicated holes may be formed in or designed into the formatter PCB 140 and/or the interposer 135.

As the most critical thermal elements of the reflective spatial light modulator such as the DMD are the getter strips, in a preferred embodiment the at least one heat pipe or at least two heat pipes or at least one or at least two conductive massive metallic heat transporters or the circulating cooling circuit are configured to pass in proximity to the getter strips. As there are usually two getter strips located on two opposite sides of the DMD active array, the at least two heat pipes or at least two conductive massive metallic heat transporters or the at least two conduits of the circulating cooling circuit preferably traverse the interposer 135 in proximity to those sides, as illustrated especially in FIGS. 2 and 3. Thus, the heat pipes or the conductive massive metallic heat transporters or the at least two conduits of the circulating cooling circuit traverse the frame of the interposer where there are no electronic components.

To provide the shortest thermal path, the at least one or at least two heat pipes or at least one or at least two conductive massive metallic heat transporters, or the at least two conduits of the circulating cooling circuit e.g. are 3 cm or more in length and are preferably straight elements and go directly through the formatter PCB 140 and/or interposer.

As shown in FIG. 2, the cooling block 150 comprises a pair of thermo-conductive mechanical fixings such as clamps 151 or any other thermal connection for example to receive the pair of thermal bridges.

The number of thermal bridges depends on the application and the type of reflective spatial light modulator such as the DMD. Preferably, an even number of thermal bridges is provided for symmetrical purposes, for example, two, four, etc. In the present embodiment, a thermal bridge with two heat pipes is provided.

The thermal bridge of any of the embodiments of the present invention is particularly advantageous when used in a light projection system comprising a prism for splitting and recombining a light beam, and three reflective spatial light modulator such as the DMDs as described above. FIG. 7 shows a three-chip projector according to the prior art, which includes three reflective spatial light modulators such as the DMDs. The front cooling frame 115 of each reflective spatial light modulator, such as the DMD, is cooled by means of at least one or at least two conductive massive metallic heat transporters or at least one or at least two heat pipes connected to a common heat sink, as described, for example, in patent application EP 1 863 296 A1. In other embodiments, the at least one or at least two conductive massive metallic heat transporters or the at least one or at least two heat pipes or the at least two conduits of the circulating cooling circuit are connected each to a separate heat sink. The three light modulators need to be perfectly aligned as the images generated by the light modulators need to be superimposed preferably with sub-pixel accuracy which can be achieved with embodiments of the present invention. During the installation and alignment of prior art light modulators, the heat conductive elements attached to the front cooling frames 115 can provide additional mechanical stresses to the light projection system. Removing the attachment of front cooling of the prior art, and replacing it with the thermal bridge of the present invention removes these mechanical stresses. Furthermore, it reduces the number of components in the small space between the light modulators, in which a prism is already installed. Thus, the light projection system can be made more compact as well.

A second embodiment according to the present invention provides a further technical solution to heat transfer from the front of a reflective spatial light modulator, such as a DMD, by means of a circulating cooling circuit which feeds a cooling channel provided inside the bezel of the reflective spatial light modulator such as the DMD.

Patent US 2002/0163625 A1 describes a prism cooling device comprising a cooling section for cooling the colour separation/colour combining prism by a liquid refrigerant. Further, the cooling section also serves to cool the surface of the image display element opposite to the display surface by the liquid refrigerant.

The purpose of maintaining a low temperature gradient within the reflective spatial light modulator such as a DMD is, for example to protect the getters. Thus, embodiments of the present invention also provide means to directly control the temperature of the getter strips by providing a cooling channel within the light valve bezel, e.g. made of Kovar.

Figure 5A:
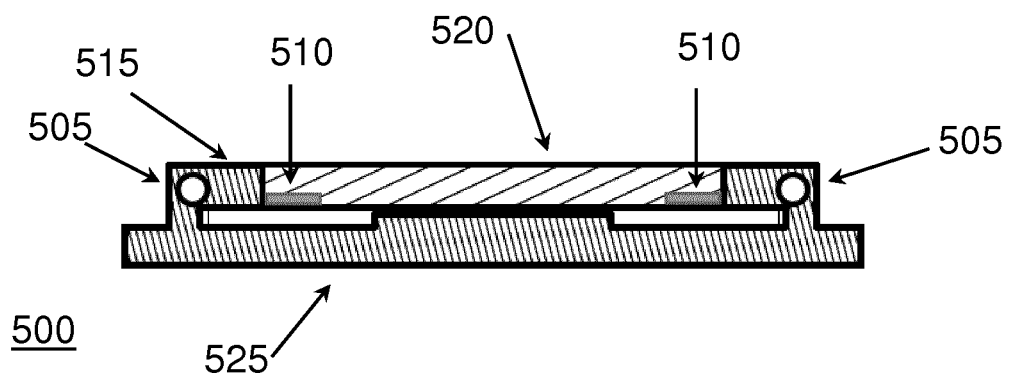
FIG. 5a shows a DMD comprising a cooling channel within the DMD bezel according to an embodiment of the present invention.

FIGS. 5a to 5d illustrate a reflective spatial light modulator subsystem 500 such as including a DMD 522 comprising a gas or liquid cooling channel 505 within the spatial light modulator bezel 515, usually made of Kovar. FIG. 5a is a cross-sectional view through the getter strips 510 of the reflective spatial light modulator subsystem 500 such as including a DMD 522. The getter strips 510 are located along two sides of the rectangular optical window 520 which protects the reflective spatial light modulator such as the micro-mirror array DMD 522 The bezel 515, e.g. made of Kovar surrounds the reflective spatial light modulator such as the micro-mirror array 522 located within the optical window 520 and a cooling channel 505 is provided inside the bezel 515.

Figure 5B:
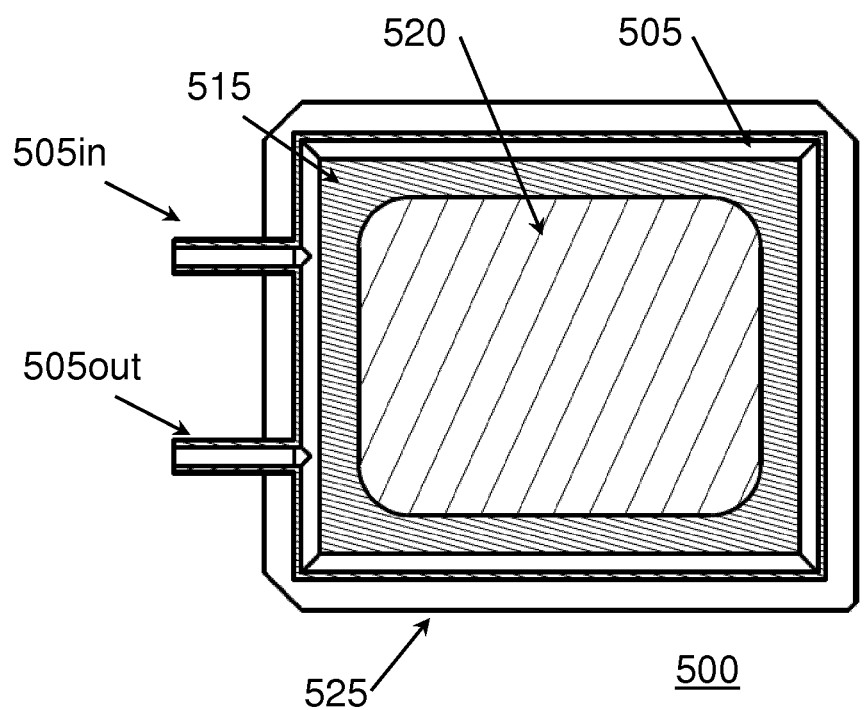
FIG. 5b shows a top view of the DMD shown on FIG. 5a with the cooling channel path.

FIG. 5b illustrates a top view of the reflective spatial light modulator subsystem 500 of FIG. 5a, wherein the inlet 505in and the outlet 505out for the cooling gas or liquid are shown with the cooling channel 505. Element 525 is a ceramic carrier.

Figure 5C:
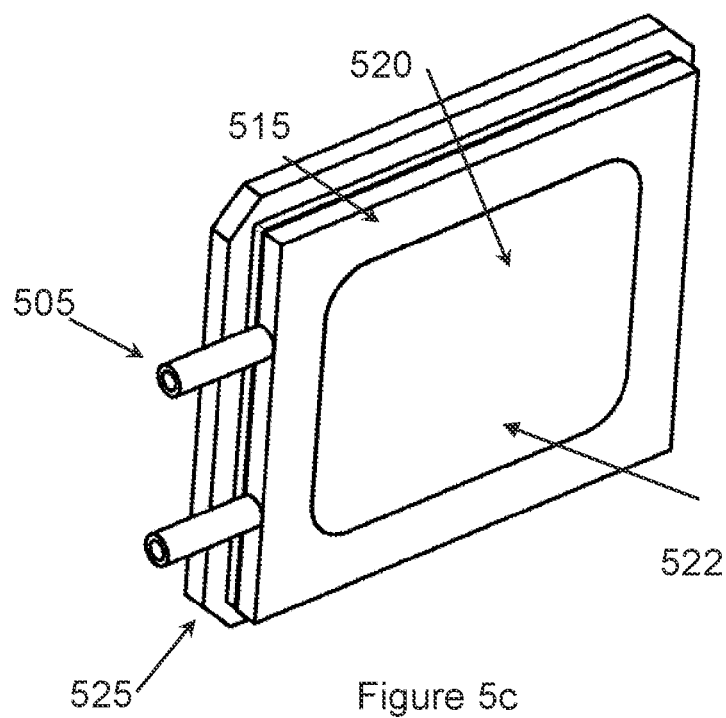
FIG. 5c shows a view in perspective of FIGS. 5a and 5b.
Figure 5D:
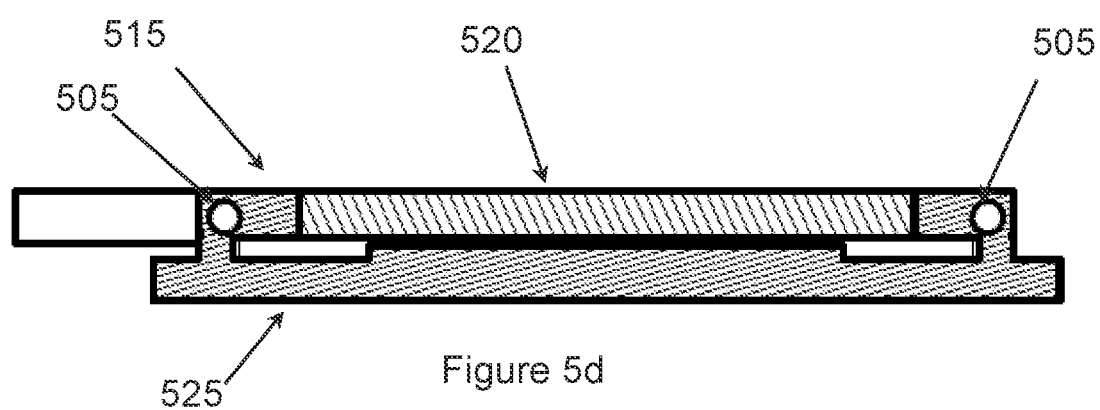
FIG. 5d shows a cross section view of FIG. 5c.

FIG. 5c is a perspective view of the reflective spatial light modulator subsystem 500 showing the ceramic carrier 525 and the inlet or outlet 505in and 505out. FIG. 5d is a cross sectional view of the reflective spatial light modulator subsystem 500 cut at 90° to the cross-section of FIG. 5a, the section passing through the inlet or outlet 505in and 505out and not through the getter strips 510.

As the gas or liquid channel 505 is located in close proximity to the getter strips 510 it can very efficiently cool the latter and thereby increase the lifetime of the 500.

Cooling pipes (not shown) can be connected to the inlet and outlet 505in and 505out and can be located in the holes through the interposer and/or PCB formatter as described above for the heat pipes. Further, a circulating cooling circuit with a pump and a controller for controlling flow can be provided. The cooling pipes can be thermally integrated into the back cooling using thermal contact and thermal conduction as described above for the heat pipes. When the back cooling is a liquid cooling, the liquid cooling of the front bezel can be hydraulically integrated into the back cooling. However, it is preferred to have the front and the back of the DMD 522 being cooled independently. A controller can be provided to control gas or liquid flow and/or temperature in the front and back cooling independently and separately to keep the thermal gradient within an acceptable tolerance.

In the embodiment of a DMD 522 shown in FIGS. 5a to d, the frame 515 can be brazed to the ceramic carrier 525 e.g. forming a resistance weld around the perimeter. A hermetic glass-to-metal seal can be provided. In this embodiment, the cooling channel 505 is also embedded inside the bezel 515.

A third embodiment according to the present invention provides a further technical solution to heat transfer from the front of a reflective spatial light modulator such as a DMD by means of a circulating cooling circuit feeding a flooding a cooling medium, e.g. liquid or gas over the face of the reflective spatial light modulator such as the DMD.

The purpose of maintaining a low temperature gradient within the reflective spatial light modulator such as a DMD is, for example, to protect the getter strips. Thus, in this embodiment of the present invention, means to directly control the temperature of the getter strips by providing a flooding of the surface of the modulator such as a DMD is provided.

FIGS. 6a to c illustrate a reflective spatial light modulator subsystem 600 such as including a DMD 622 comprising an overflow frame 636 and an inlet 605in and outlet 605out to the cooling frame 636 for circulation of a cooling medium such as a liquid or a gas. At least conduits connected to the inlet and outlet respectively can be provided with coolant from a circulating cooling circuit. The circuit can include a pump and a controller to control flow. FIG. 6a is a cross-sectional view through the reflective spatial light modulator subsystem 600 such as including a DMD 622. The getter strips can be located along two sides of the rectangular optical window 620 which protects the reflective spatial light modulator such as the micro-mirror array DMD 622. The overflow frame 636 lies on and can surround the top surface of reflective spatial light modulator such as the micro-mirror array 622 located within the optical window 620. The overflow frame 636 covers a flooding cavity 638 through which the cooling medium flows across the top of the reflective spatial light modulator such as the micro-mirror array DMD 622. An inlet 605in and an outlet 605out for the cooling medium are shown. Element 625 is a ceramic carrier.

FIG. 6b illustrates a top view of the reflective spatial light modulator subsystem 600 of FIG. 6a showing an overflow frame 636 with the inlet 605in and the outlet 605out for the cooling medium and the optical window 620. Light is incident on and exits from the reflective spatial light modulator such as the micro-mirror array DMD 622 through the liquid or gas cooling flowing through the flooding cavity 638.

FIG. 6c is a partly exploded perspective view of the reflective spatial light modulator subsystem 600 showing the inlet and outlet 605in and 605out, respectively to and from the flooding cavity 638.

As the flooding cavity 638 is located above and in close proximity to the getter strips 510 it can very efficiently cool the latter and thereby increase the lifetime of the reflective spatial light modulator 600.

Cooling conduits (shown schematically by dashed lines 640 in FIG. 6a) of the embodiments shown in FIG. 5 or 6 are connected to the inlet and outlet 505in, 605in and 505out, 605out, respectively and can be located in the holes through the interposer and/or PCB formatter as describe above for the heat pipes. The cooling conduits can have an Enhanced Heat Transfer cross-sectional for channelling large amounts of heat to the back cooling. These cooling conduits can be thermally integrated into the back cooling using thermal conduction as described above for the heat pipes. When the back cooling is a liquid cooling, the liquid cooling of the front overflow frame 636 which covers a flooding cavity 638 can be hydraulically integrated into the back cooling. However, it is preferred to have the front and the back of the DMD 622 being cooled independently. A controller can be provided to control cooling medium flow in the front and back cooling and/or temperature to keep the thermal gradient within an acceptable tolerance.

As the cooling medium is traversed by light incident on and leaving the reflective spatial light modulator, the cooling medium should be selected so that it is and remains transparent. Highly purified water can be used. The cooling medium can also be selected so that it absorbs infra-red and/or ultraviolet light to protect the reflective spatial light modulator and any optical element downstream of the reflective spatial light modulator. For example, the liquid coolant can include a solvent and an ultra-violet absorbing substance which is soluble in the solvent. Examples of such substances are benzophenones and benzotriazoles such as benzophenonesphosphates, benzotriazolephosphates, benzophenonessulphates, benzotriazolesulphates, phenylbenzimidazole sulfonic acid, butyl metoxydibenzoylmethane, Octyldimethyl PABA, Octyl Methoxycinnamate.

To absorb infra-red a solvent and an infra-red absorbing substance which is soluble in the solvent can be used. Infra-red absorbing additives can include carbo-cyanines or indocyanine green (ICG).

An optical sensor can be provided to determine any aging and discolouring of the cooling liquid. If the output of the sensor indicates that the cooling liquid is no longer transparent, a maintenance can be scheduled and the cooling liquid can be replaced.

While the invention has been described hereinabove with reference to specific embodiments, this was done to clarify and not to limit the invention. The skilled person will appreciate that various modifications and different combinations of disclosed features are possible without departing from the scope of the invention.

The invention claimed is:

1. An image modulating system comprising:
a reflective spatial light modulator system comprising a formatter plate (PCB), an interposer, a back cooling, a front cooling and a reflective spatial light modulator, the reflective spatial light modulator having a front and a back,
wherein at least one heat conductor with an Enhanced Heat Transfer conductor or a non-Enhanced Heat Transfer conductor cross-sectional surface with reference pure copper is configured to transfer heat between the front cooling and the back cooling so as to reduce the thermal gradient between the front and back of the reflective spatial light modulator, the Enhanced Heat Transfer or the non-Enhanced Heat Transfer conductor being thermo-conductively connected to the front cooling and to the back cooling, and
wherein the Enhanced Heat Transfer or the non-Enhanced Heat Transfer conductor passes through the formatter plate.

2. The image modulating system according to claim 1, wherein the at least one heat conductor with an Enhanced Heat Transfer is a heat pipe.

3. The image modulating system according to claim 2, wherein the at least one heat pipe has a length of at least 3 cm.

4. The image modulating system according to claim 2, wherein the diameter of the at least one heat pipe is in the range of 3 mm to 10 mm.

5. The image modulating system according to claim 2, wherein the at least one heat pipe is straight.

6. The image modulating system according to claim 1, wherein the at least one heat conductor with an Enhanced Heat Transfer is a conduit with circulating fluid.

7. The image modulating system according to claim 1, wherein the at least one heat conductor with a non-Enhanced Heat Transfer is a conductive massive metallic heat transporter.

8. The image modulating system according to claim 1, wherein the back cooling is a back cooling block.

9. The image modulating system according to claim 1, wherein the front cooling is a front cooling frame.

10. The image modulating system according to claim 1, wherein sides of the reflective spatial light modulator have getter strips and the at least one heat conductor with an Enhanced Heat Transfer or a non-Enhanced Heat Transfer cross-sectional surface with reference pure copper is configured to contact the front cooling on two opposite sides of the reflective spatial light modulator which correspond to the sides of the reflective spatial light modulator which comprise the getter strips.

11. The image modulating system according to claim 8, wherein the back cooling block is at least one of an array of air cooling fins, a Peltier element, a gas or liquid cooled heat sink, a passive heat sink, an air-cooled heat sink.

12. The image modulating system according to claim 1, wherein the reflective spatial light modulator is at least one of an LC panel, an LCOS or a Digital Micro-mirror Device, or an LCoS phase modulator used for beam steering.

13. The image modulating system according to claim 1, comprising a plurality of reflective spatial light modulator systems, each system having a formatter plate (PCB), an interposer, a back cooling, a front cooling and a reflective spatial light modulator, further comprising a controller to control the cooling of each of the plurality of reflective spatial light modulator systems separately and independently.

14. The image modulating system according to claim 1, further comprising a controller to control the temperature of the back cooling and the front cooling separately and independently.

15. A projector comprising three image modulating systems according to claim 1.

16. The projector according to claim 15, comprising a plurality of reflective spatial light modulator systems, the projector being configured to control each reflective spatial light modulator system separately.

17. An image modulating system comprising:
a reflective spatial light modulator having a front and a back cooling and fluid cooling means, the fluid cooling means being configured for cooling the front of the reflective spatial light modulator and for transferring heat taken from the front cooling of the front of the reflective spatial light modulator to the back cooling, the reflective spatial light modulator having a package and conduits being connected to the fluid cooling means, the conduits passing through the package.

18. The image modulating system according to claim 17, further comprising a bezel of a light valve of the image modulating system having a cooling medium channel provided within the bezel.

19. The image modulating system according to claim 17, further comprising an overflow frame having a flooding cavity for contacting cooling fluid with the front of the reflective spatial light modulator.

20. A method of cooling an image modulating system comprising a reflective spatial light modulator system having a formatter plate (PCB), an interposer, a back cooling, a front cooling and a reflective spatial light modulator, the reflective spatial light modulator having a front and a back, the method comprising:
transferring heat between the front cooling and the back cooling through an Enhanced Heat Transfer conductor or a non-Enhanced Heat Transfer conductor so as to reduce the thermal gradient between the front and back of the reflective spatial light modulator, the Enhanced Heat Transfer conductor or the non-Enhanced Heat Transfer conductor being thermo-conductively connected to the front cooling and to the back cooling, and wherein the Enhanced Heat Transfer conductor or the non-Enhanced Heat Transfer conductor passes through the formatter plate.

21. The method according to claim 20, wherein sides of the reflective spatial light modulator have getter strips further comprising cooling the front cooling on two opposite sides of the reflective spatial light modulator which correspond to the sides of the reflective spatial light modulator which comprise the getter strips.

\* \* \* \* \*